US007880127B2

(12) United States Patent
Garris

(10) Patent No.: US 7,880,127 B2
(45) Date of Patent: Feb. 1, 2011

(54) APPARATUS AND METHOD FOR ALIGNING AN IMAGE SENSOR INCLUDING A HEADER ALIGNMENT MEANS

(75) Inventor: William Eric Garris, Salem, VA (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 179 days.

(21) Appl. No.: 12/259,008

(22) Filed: Oct. 27, 2008

(65) Prior Publication Data

US 2010/0102213 A1 Apr. 29, 2010

(51) Int. Cl.
*H01L 27/00* (2006.01)

(52) U.S. Cl. .................................... 250/208.1; 250/548

(58) Field of Classification Search .............. 250/208.1, 250/239, 548, 214.1; 257/678–693, 440, 257/80, 84; 385/89, 92
See application file for complete search history.

(56) References Cited

U.S. PATENT DOCUMENTS

| | | | | |
|---|---|---|---|---|
| 4,039,877 | A | 8/1977 | Wimmer | |
| 4,044,374 | A | 8/1977 | Roberts et al. | |
| 4,178,529 | A | 12/1979 | Kennedy | |
| 4,682,021 | A | 7/1987 | Fitts | |
| 5,051,802 | A * | 9/1991 | Prost et al. | 257/434 |
| 5,493,111 | A | 2/1996 | Wheeler et al. | |
| 5,510,673 | A | 4/1996 | Wodecki et al. | |
| 5,994,824 | A | 11/1999 | Thomas et al. | |
| 6,040,657 | A | 3/2000 | Vrescak et al. | |
| 6,331,753 | B1 | 12/2001 | Iosue | |
| 6,483,231 | B1 | 11/2002 | Iosue | |
| 6,586,877 | B1 | 7/2003 | Suyama et al. | |
| 6,747,258 | B2 | 6/2004 | Benz et al. | |
| 6,847,027 | B2 | 1/2005 | Iosue | |
| 7,148,461 | B2 | 12/2006 | Shimoi et al. | |
| 7,262,405 | B2 * | 8/2007 | Farnworth et al. | 250/239 |
| 7,482,571 | B2 | 1/2009 | Thomas | |
| 2004/0245925 | A1 | 12/2004 | Yamauchi et al. | |
| 2005/0258212 | A1 | 11/2005 | Costello | |

FOREIGN PATENT DOCUMENTS

| | | |
|---|---|---|
| EP | 2 144 273 | 1/2010 |
| FR | 2 677 808 | 12/1992 |

OTHER PUBLICATIONS

Weisser, Wolfgang, EPO Examiner, EPO Search Report for EP 09 17 4008, Jul. 23, 2010, Munich, DE.

* cited by examiner

*Primary Examiner*—Que T Le
(74) *Attorney, Agent, or Firm*—RatnerPrestia

(57) ABSTRACT

An imaging device and a method for aligning an image sensor within the imaging device are disclosed. The imaging device comprises a housing and an image sensor assembly including a header and an image sensor mounted to the header. The header of the image sensor assembly is coupled to the housing. Means for aligning the image sensor with respect to the header are provided. Means for aligning the header with respect to the housing of the imaging device are also provided. A distance separating the image sensor alignment means and the header alignment means is pre-determined such that a distance between the image sensor and the housing of the imaging device is pre-determined.

14 Claims, 8 Drawing Sheets

APPARATUS AND METHOD FOR ALIGNING AN IMAGE SENSOR INCLUDING A HEADER ALIGNMENT MEANS

BACKGROUND OF THE INVENTION

Image intensifier devices are employed in night visions systems to convert a dark environment to a bright environment that is perceivable by a viewer. Night vision systems have industrial, commercial and military applications. The image intensifier device collects tiny amounts of light in a dark environment, including the lower portion of the infrared light spectrum, that are present in the environment but imperceptible to the human eye. The device amplifies the light so that the human eye can perceive the image. The light output from the image intensifier device can either be supplied to a camera, external monitor or directly to the eyes of a viewer.

Image intensifier devices generally include three basic components mounted within an evacuated housing, namely, a photocathode (commonly called a cathode), a microchannel plate (MCP) and an anode. The photocathode is a photosensitive plate capable of releasing electrons when it is illuminated by light. The MCP is a thin glass plate having an array of channels extending between one side (input) and another side (output) of the glass plate. The MCP is positioned between the photocathode and the anode.

The outer surfaces of the MCP may be coated with an ion barrier film. Coating the exterior surfaces of the MCP with a thin film achieves an appreciable improvement in the performance and service life of the image intensifier tube, as compared with filmless MCP's. Incorporating a filmed MCP into an image intensifier tube has generated a new set of challenges. Solutions to meet those challenges are described herein.

In operation, an incoming electron from the photocathode enters the input side of the MCP and strikes a channel wall. When voltage is applied across the MCP, the incoming or primary electrons are amplified, generating secondary electrons. The secondary electrons exit the channel at the output side of the MCP. The secondary electrons exiting the MCP channel are negatively charged and are therefore, attracted to the positively charged anode. The anode may be a phosphor screen, or a silicon imager such as a complementary metal oxide semiconductor (CMOS) or a charged coupled device (CCD), for example.

The three basic components of the image intensifier device are positioned within an evacuated housing or vacuum envelope. The vacuum facilitates the flow of electrons from the photocathode through the MCP and to the anode. A non-evaporable getter is positioned in the evacuated housing for maintaining the vacuum condition by collecting gas molecules. Non-evaporable getter devices, which are well known in the art, are used to exhaust unwanted gases from evacuated electron tubes. The use of getter materials is based on the ability of certain solids to collect free gases by adsorption, absorption or occlusion, as is well known in the art. Promoting and maintaining vacuum within the image intensifier device housing is a goal of image intensifier device manufacturers. With that goal in mind, the image intensifier device described herein maximizes the use of getter material and incorporates sealing structures in the interest of maintaining a vacuum condition within the housing.

There is a continuing need to further develop and refine the components of image intensifier devices and methods for assembling image intensifier devices in the interest of performance, reliability, manufacturability, cost and ease of assembly.

The following U.S. patents are incorporated by reference herein in their entirety: U.S. Pat. No. 5,493,111 to Wheeler et al., U.S. Pat. No. 6,586,877 to Suyama et al., U.S. Pat. No. 6,040,657 to Vrescak et al., U.S. Pat. No. 6,747,258 to Benz et al., U.S. Pat. No. 6,331,753 to Iosue, U.S. Pat. No. 4,039,877 to Wimmer, U.S. Pat. No. 5,510,673 to Wodecki et al., U.S. Pat. No. 6,483,231 to Iosue, U.S. Pat. No. 5,994,824 to Thomas, U.S. Pat. No. 6,847,027 to Iosue, and U.S. Pat. No. 5,994,824 to Thomas. The following U.S. patent applications are incorporated by reference herein in their entirety: Ser. No. 11/193,065 to Costello, Ser. No. 11/194,865 to Thomas, Ser. No. 10/482,767 to Yamauchi et al. and Ser. No. 10/973,336 to Shimoi et al.

SUMMARY OF THE INVENTION

According to one aspect of the invention, an imaging device is disclosed. The imaging device comprises a housing and an image sensor assembly including a header and an image sensor mounted to the header. The header of the image sensor assembly is coupled to the housing. Means for aligning the image sensor with respect to the header are provided. Means for aligning the header with respect to the housing of the imaging device are also provided. A distance separating the image sensor alignment means and the header alignment means is pre-determined such that a distance between the image sensor and the housing of the imaging device is pre-determined.

According to another aspect of the invention, the image sensor assembly includes a header that is coupled to the housing and an image sensor that is mounted within a recessed mounting surface defined in the header. A recess is formed in a surface of the header, wherein a protrusion of the housing is positioned in the recess such that the header is positioned on the housing. A distance between the recess of the header and the recessed mounting surface of the header is pre-determined, such that a distance between the image sensor and the housing of the imaging device is pre-determined.

According to another aspect of the invention, a method of aligning an image sensor with respect to a housing of an imaging device is disclosed. The method includes the step of positioning an image sensor on a mounting surface of a header. The image sensor is aligned with a first alignment element defined or positioned on the mounting surface of the header. The header is positioned within the housing. A second alignment element of the header is aligned with an alignment element defined or positioned on a surface of the housing of the imaging device.

BRIEF DESCRIPTION OF THE DRAWINGS

The invention is best understood from the following detailed description when read in connection with the accompanying drawing. Included in the drawing are the following figures.

DETAILED DESCRIPTION OF THE INVENTION

The invention is best understood from the following detailed description when read in connection with the accompanying drawing figures, which show an exemplary embodiment of the invention selected for illustrative purposes. Such figures are intended to be illustrative rather than limiting and are included herewith to facilitate the explanation of the present invention. The invention is not intended to be limited to the details shown. Although the invention is illustrated and described herein with reference to a specific embodiment, various modifications may be made in the details within the scope and range of equivalents of the claims and without departing from the invention.

Figure 1:
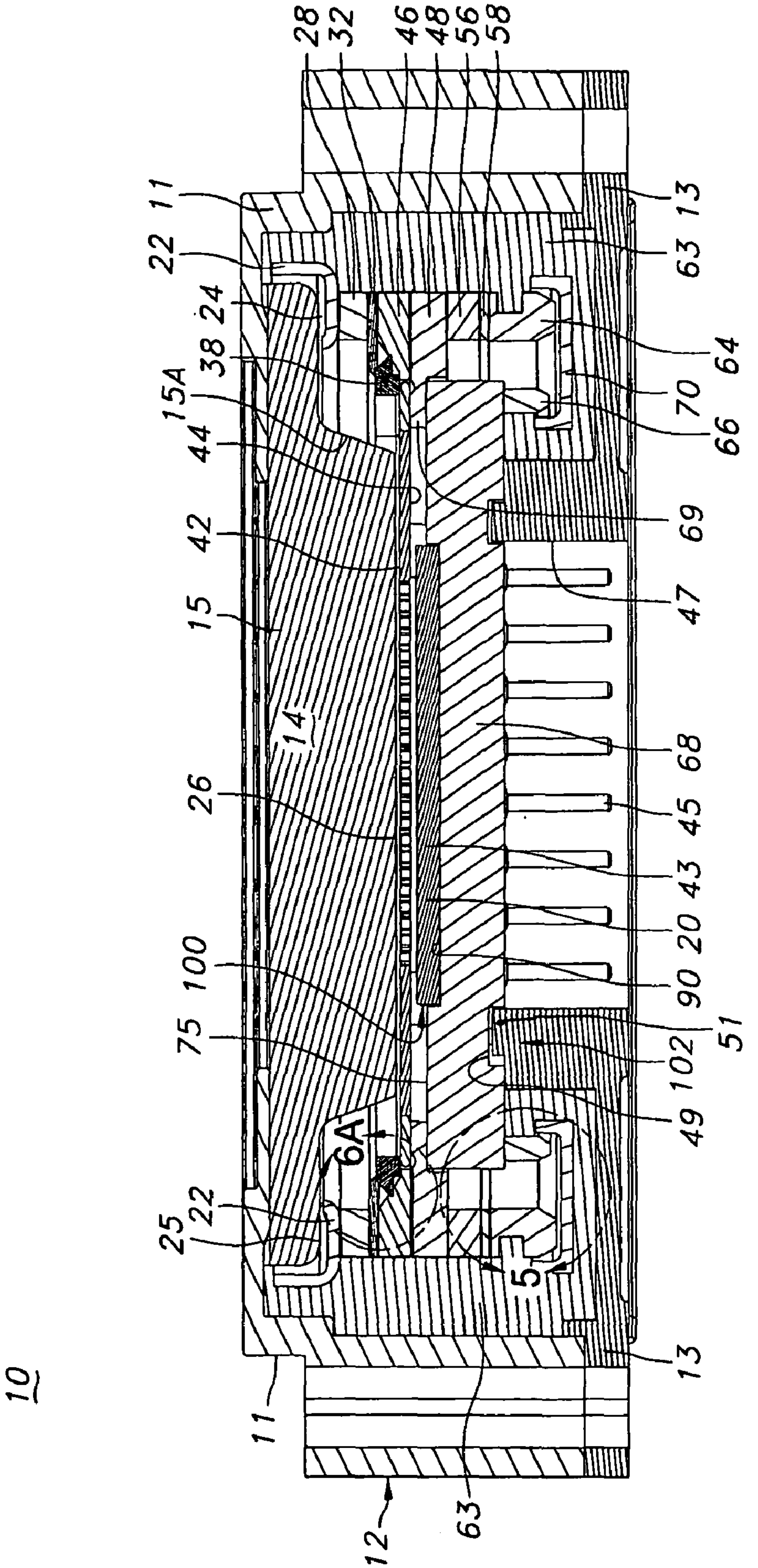
FIG. 1 depicts a cross-sectional side elevation view of an image intensifier tube according to one exemplary embodiment of the invention.

FIG. 1 depicts a cross-sectional view of an image intensifier tube 10 (hereinafter tube 10) according to one exemplary embodiment of the invention. Tube 10 includes an evacuated housing 12 including a front cover 11 that is mounted to a rear cover 13. Within housing 12, there is positioned photocathode 14, microchannel plate (MCP) 16 and anode 20 (otherwise referred to as image sensor 20).

The photocathode 14 is attached to faceplate 15 having a sloped portion 15A and a flat portion 24 which rests upon a conductive support ring 22 at one end of vacuum housing 12. A metalized layer 25 generally composed of chrome, is deposited upon flat portion 24 to conductively engage support ring 22. The metalized layer 25 extends continuously along sloped portion 15A to conductively engage both photocathode 14 and faceplate 15. The abutment of the photocathode faceplate 15 against support ring 22 creates a seal to close one end of vacuum housing 12. The support ring 22 contacts metalized layer 25 on the faceplate of photocathode 14. The metalized layer 25 is coupled to a photoresponsive layer 26. As such, an electrical is bias may be applied to photoresponsive layer 26 of photocathode 14 within the evacuated environment by applying an electrical bias to support ring 22 on the exterior of vacuum housing 12.

A first annular ceramic spacer 28 is positioned below support ring 22. The first ceramic spacer 28 is joined to support ring 22 by a first copper brazing ring (not shown), which is joined to both first ceramic spacer 28 and support ring 22 during a brazing operation. The brazing operation creates an air impervious seal between support ring 22 and first ceramic spacer 28. An upper MCP terminal 32, provided in the form of a metallic contact ring, is joined to first ceramic spacer 28, opposite support ring 22. A second brazing ring (not shown) is interposed between the upper MCP terminal 32 and the first ceramic spacer 28. The upper MCP terminal 32 is also joined to first ceramic spacer 28 in a brazing operation. The upper MCP terminal 32 extends into vacuum housing 12 where it conductively engages a metallic snap ring 38. The metallic snap ring 38 engages a conductive upper surface 42 of MCP 16. Engagement between metallic snap ring 38 and MCP 16 is described in greater detail with reference to FIG. 5A. An electrical bias may be applied to conductive upper surface 42 of MCP 16 by applying the electrical bias to upper MCP terminal 32 on the exterior of the vacuum housing 12.

A second ceramic spacer 46 is positioned below upper MCP terminal 32, isolating upper MCP terminal 32 from lower MCP terminal 48. The second ceramic spacer 46 is brazed to both upper MCP terminal 32 and lower MCP terminal 48, as such a third brazing ring (not shown) is interposed between upper MCP terminal 32 and second ceramic spacer 46 and a fourth brazing ring (not shown) is interposed between second ceramic spacer 46 and lower MCP terminal 48. The lower MCP terminal 48 extends into vacuum housing 12 and engages the lower conductive surface 44 of MCP 16. As such, lower conductive surface 44 of MCP 16 may be coupled to ground by connecting lower MCP terminal 48 to a ground potential external to vacuum housing 12.

A third ceramic spacer 56 separates lower MCP terminal 48 from getter support 58. The third ceramic spacer 56 is brazed to both lower MCP terminal 48 and getter support 58. As such, a fifth brazing ring (not shown) is interposed between lower MCP terminal 48 and third ceramic spacer 56. Similarly, a sixth brazing ring (not shown) is interposed between third ceramic spacer 56 and getter support 58. An exterior sealing member 64 is positioned below getter shield 58. The exterior sealing member 64 is brazed to getter shield 58. As such, a seventh brazing ring (not shown) is positioned above exterior sealing member 64.

A segment 69 of lower MCP terminal 48 rests between MCP 16 and a ceramic header 68. An anode 20, in the form of a CMOS imager die 43, is mounted to a surface of header 68. Operation of a CMOS imager will be understood to those skilled in the art. Alternatively, anode 20 may be a phosphor screen or another type of silicon imager such as a charged coupled device (CCD), for example. Mounting of CMOS die 43 onto ceramic header 68 is described in greater detail with reference to FIGS. 2A and 2B. Segment 69 of lower MCP terminal 48 separates lower conductive surface 44 of MCP 16 from the top surface of CMOS die 43 by a pre-determined, precise distance.

An interior sealing member 66 is positioned beneath ceramic header 68. The interior sealing member 66 is brazed to ceramic header 68. As such, an eight brazing ring (not shown) is interposed between ceramic header 68 and interior sealing member 66. The lower end of vacuum housing 12 is vacuum-sealed by the presence of exterior sealing member 64 and interior sealing member 66. The sealing members 64 and 66 both seal against a seal cup 70. Sealing engagement between sealing members 64 and 66 and seal cup 70 is described in greater detail with reference to FIG. 5. The combination of the aforementioned brazed interfaces, potting material 63, and seals form an air tight envelope defined by vacuum housing 12.

A plurality of electrical pins 45 are positioned through the body of ceramic header 68 for conductive electrical contact with electrical leads (not shown) extending from CMOS die 43. Power, ground and/or signals are distributed through pins 45. The rear cover 13 includes an aperture 47 to accommodate pins 45 such that a mating connector (not shown) may connect to pins 45 to provide power to CMOS die 43 and/or receive signals from CMOS die 43.

Referring now to the process of assembling tube 10, an important step in the assembly of an image intensifier tube is the removal of destructive organic gases from an interior region of the tube prior to vacuum sealing the tube. The organic gases emanate from the anode and/or other components of the tube. Removal of the organic gases, prior to vacuum sealing the tube, improves the performance and service life of the image intensifier tube. For image intensifier tubes having a filmless MCP, the organic gases are vacuum-drawn through the tiny channels defined in the filmless MCP and exhausted through the top end of the partially-assembled tube. After which, the photocathode is mounted and vacuum sealed to the top end of the tube.

Unlike traditional image intensifier tubes, the surfaces of MCP 16 of tube 10 are coated with an ion barrier film. The ion barrier film is utilized to improve the performance and service life of image intensifier tube 10, as compared with traditional image intensifier tubes incorporating filmless MCP's. While filmed MCP's offer numerous performance benefits, filmed MCP's also present various challenges in assembling an image intensifier device, as described hereinafter. Organic gases emanating from a CMOS die (or other components of a tube) are restricted from passing through a filmed MCP, as a result of the ion barrier film applied to the MCP. The organic gases become trapped within the space between the MCP and the CMOS die. Because organic gases trapped within the space between the MCP and the CMOS die could potentially reduce the performance and service life of a tube it is desirable to exhaust (i.e., remove) those gases.

Figure 2:
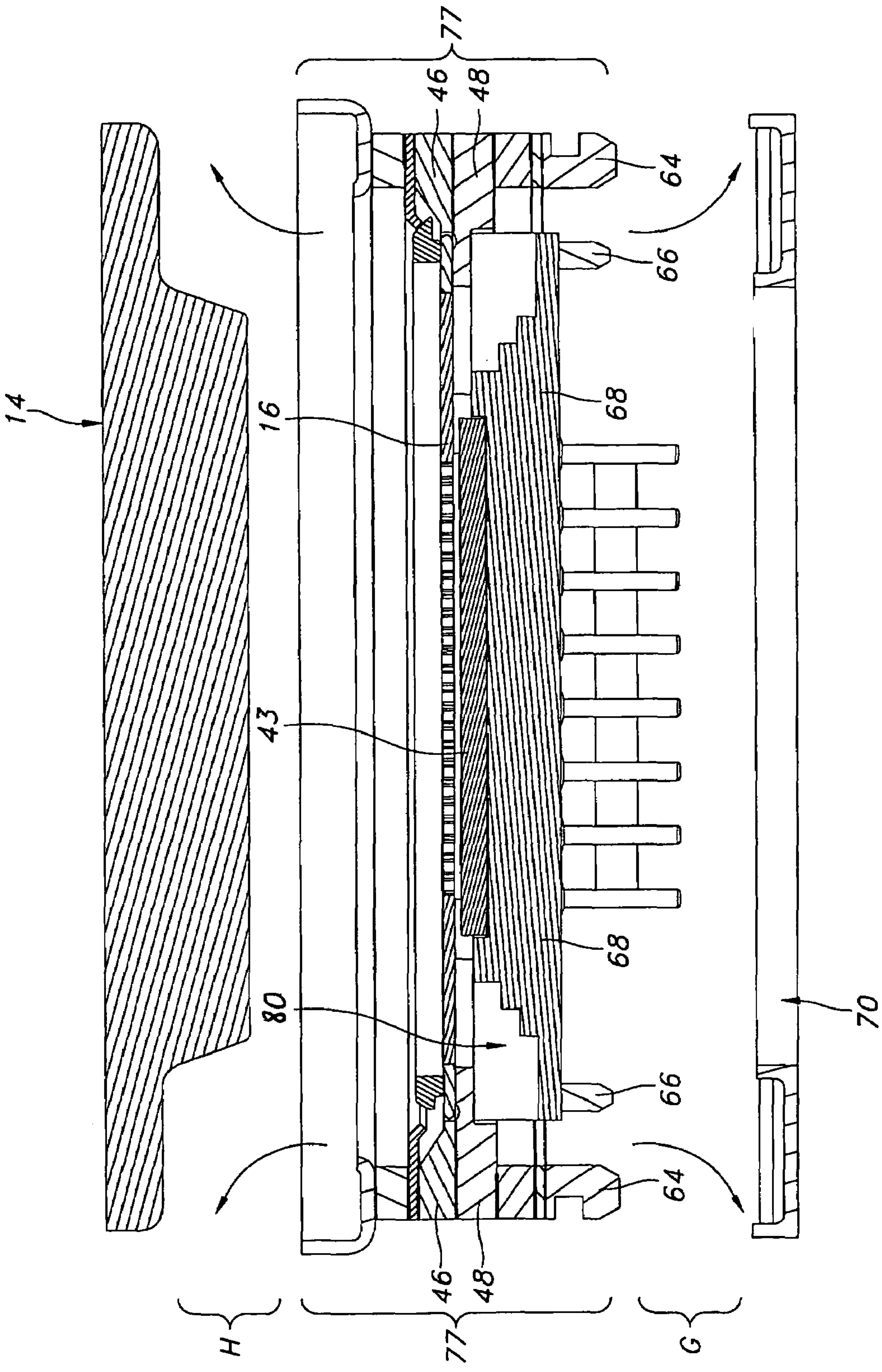
FIG. 2 depicts a cross-sectional side elevation view of a partially exploded sub-assembly of the tube of FIG. 1.

FIG. 2 depicts a cross-sectional side elevation view of a partially assembled tube 10 of FIG. 1. FIG. 2 is intended to illustrate a particular assembly step in the course of assembling tube 10. The assembly step depicted in FIG. 2 occurs immediately after assembling sub-assembly 77 and immediately prior to assembling photocathode 14 and annular seal cup 70 onto sub-assembly 77.

According to one exemplary embodiment of the invention, tube 10 includes provisions for the removal of organic gases emanating from CMOS die 43 (and/or other components of tube 10) through the lower end of tube 10, as depicted by the arrows in FIG. 2. In the assembly process depicted in FIG. 2, photocathode 14 is separated from the top end of sub-assembly 77 and annular seal cup 70 is separated from the bottom end of sub-assembly 77.

A vacuum source (not shown) draws a vacuum through the gap "H" provided between photocathode 14 and the top end of sub-assembly 77, as depicted by the arrows in FIG. 2 to exhaust organic gases trapped above MCP 16. Thereafter, photocathode 14 is brazed, or otherwise mounted, to the top end of sub-assembly 77 to seal the top end of tube 10. A vacuum source (not shown) also draws a vacuum through the gap "G" provided between annular seal cup 70 and the bottom end of sub-assembly 77. The organic gases emanating from CMOS die 43 are drawn through a passageway 80 defined between header 68 and MCP spacer 16, thereby removing organic gases trapped within the space between MCP 16 and the CMOS die 43. Thereafter, annular seal cup 70 is mounted to the bottom end of sub-assembly 77 to seal the bottom end of tube 10. Removal of organic gases through a passageway 80 defined between header 68 and MCP spacer 16 might be unique to an image intensifier tube (such as tube 10) having a filmed MCP (such as MCP 16). Image intensifier tubes utilizing a filmless MCP may not necessarily require a passageway defined between a silicon imager header and an MCP spacer because organic gases can escape through the tiny channels defined in the filmless MCP.

Figure 3A:
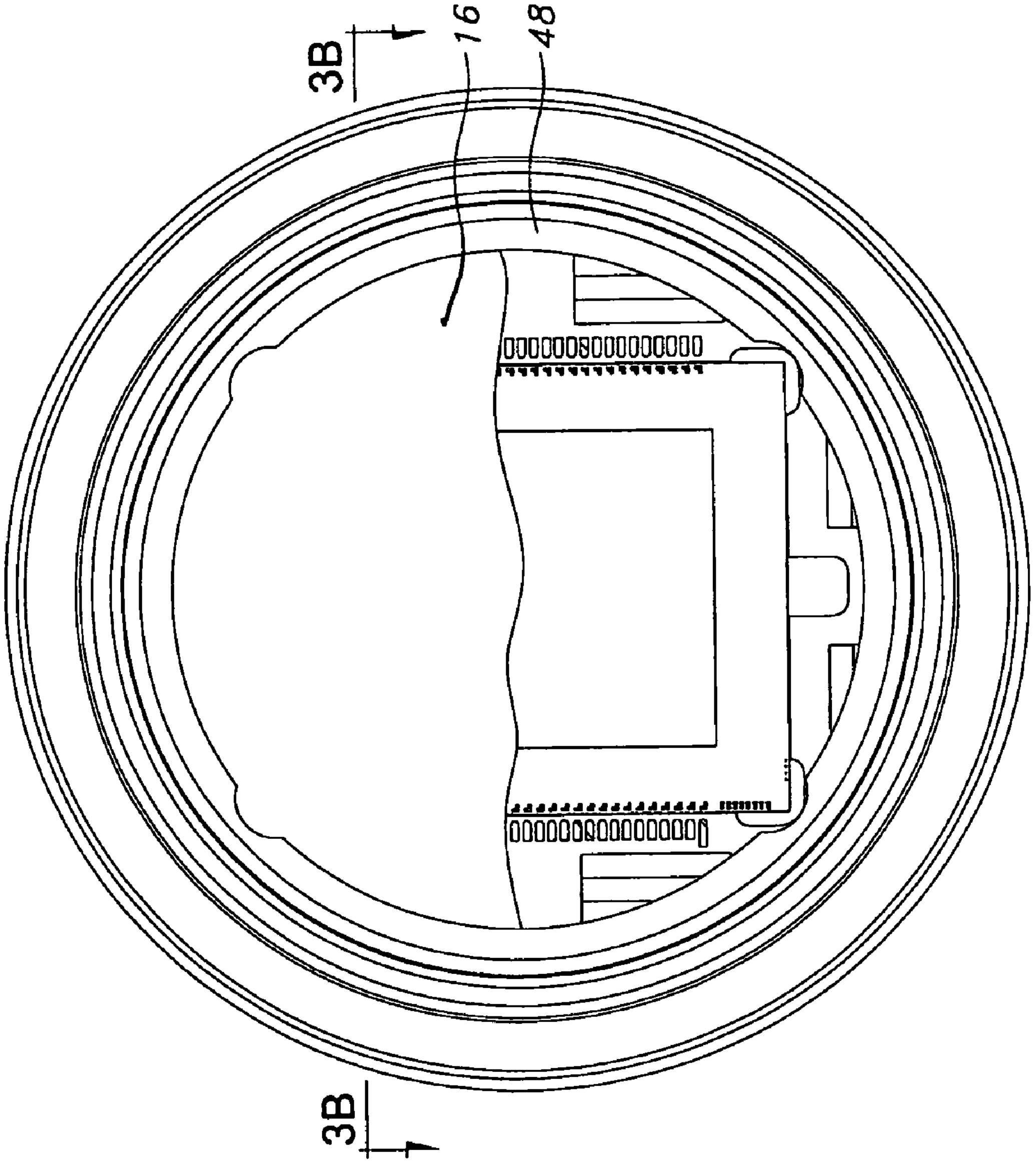
FIG. 3A depicts a top plan view of the image intensifier tube of FIG. 1 wherein the photocathode is omitted and a portion of the microchannel plate (MCP) is cut-away to reveal the CMOS imager.
Figure 3B:
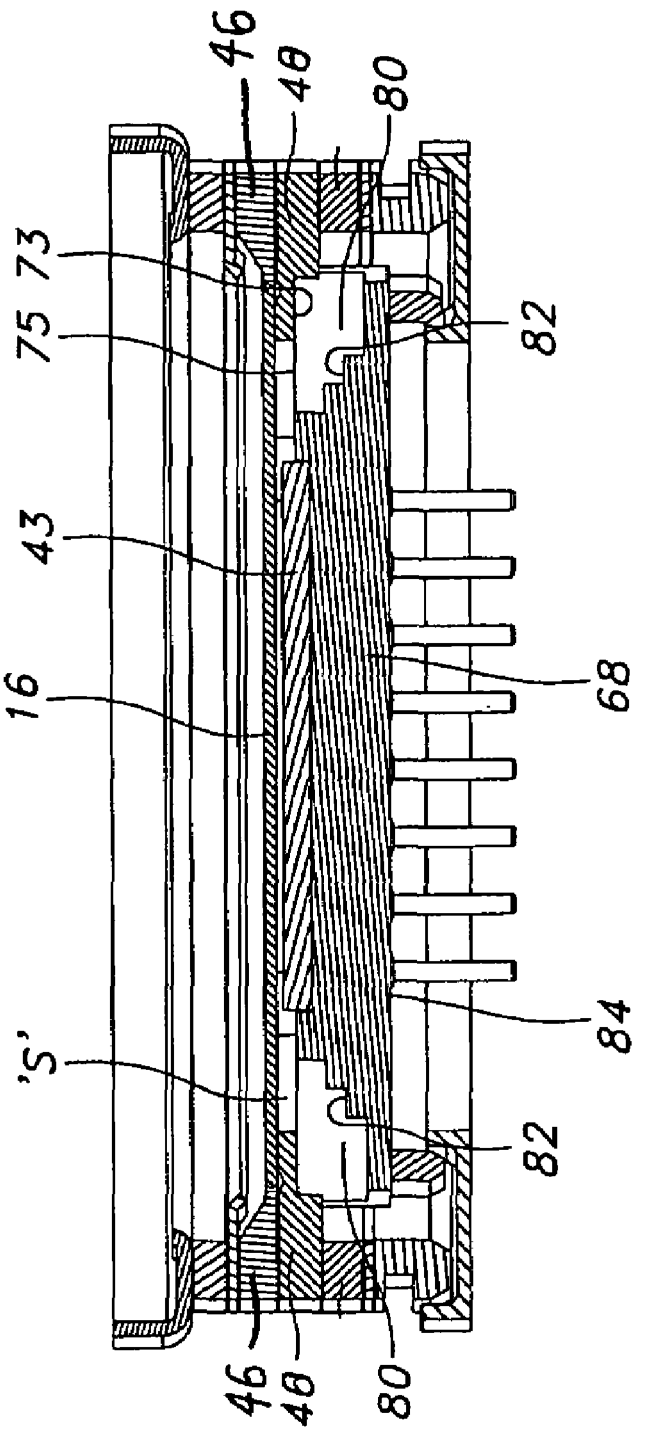
FIG. 3B is a cross-sectional side elevation view of the partial image intensifier tube of FIG. 3A taken along the lines 3B-3B.

FIG. 3A depicts a top plan view of the image intensifier tube of FIG. 1 wherein the photocathode is omitted and a portion of the micro-channel plate (MCP) is cut-away to reveal the CMOS imager. FIG. 3B is a cross-sectional side elevation view of the partial image intensifier tube of FIG. 3A taken along the lines 3B-3B. FIGS. 3A and 3B depict the passageway 80 that is defined between header 68 and MCP spacer 48. The passageway 80 is defined by a recess formed in either or both header 68 and MCP spacer 48 at the annular intersection of header 68 and MCP spacer 48.

According to the exemplary embodiment illustrated in FIGS. 3A-3B, lower surface 73 of MCP spacer 48 is positioned to face surface 75 of header 68. A brazing ring (not shown) is sandwiched between MCP spacer 48 and header 68 for mounting MCP spacer 48 to header 68. The passageway 80 is formed by a recess defined by a series of stepped surfaces 82 formed in header 68 and arranged along the circumference of header 68. Each stepped surface 82 extends from top surface 75 of header 68 to bottom surface 84 of header 68. As best shown in FIG. 4B, header 68 includes eight stepped surfaces 82 that are spaced apart along a circumference of header 68. The size, shape and number of steps of each stepped surface 82 may vary from that shown and described herein.

Getter material is deposited on stepped surfaces 82 of header 68. As described in the Background section, getter material absorbs destructive organic gases produced during operation and assembly of tube 10. Maximizing the amount of getter material within tube 10 is beneficial for maintaining a vacuum condition within housing 12 of tube 10. For that reason, steps are preferred over other geometric shapes because alternating orthogonal surfaces maximize the available surface area upon which getter material may be deposited. Accordingly, a series of stepped surfaces 82 are preferred to maximize the surface area of passageway 80 upon which getter material is deposited.

Although not shown, in another alternative embodiment, passageway 80 is formed by a recess defined by a series of stepped surfaces formed in spacer 48. In still another alternative embodiment, steps are formed in both header 68 and spacer 48 to form passageway 80 therebetween. Moreover, while alternating orthogonal surfaces in the form of steps are preferred, surface 82 may vary from that shown. According to one aspect of the invention, surface 82 may extend at any pre-determined angle with respect to mounting surface 75 of header 68.

According to one aspect of the invention, a method of fabricating an image intensifier device, such as tube 10, is provided. The method of fabricating includes the step mounting an image sensor, such as CMOS die 43, on header 68 of an anode assembly. A surface 73 of MCP spacer 48 is positioned on surface 75 of header 68 of the anode assembly such that a passageway 80 is defined at the interface between MCP spacer 48 and header 68. A filmed MCP 16 is positioned on the top surface of MCP spacer 48 such that spacer 48 is positioned between filmed MCP 16 and CMOS die 43 and a space "S" is defined between filmed MCP 16 and CMOS die 43. A vacuum is applied to draw organic gasses from the space "S" between filmed MCP 16 and CMOS die 43 and through passageway 80 defined at the interface between the spacer 48 and header 68. Getter material is deposited on surfaces of passageway 80 for absorbing organic gases.

Figure 4A:
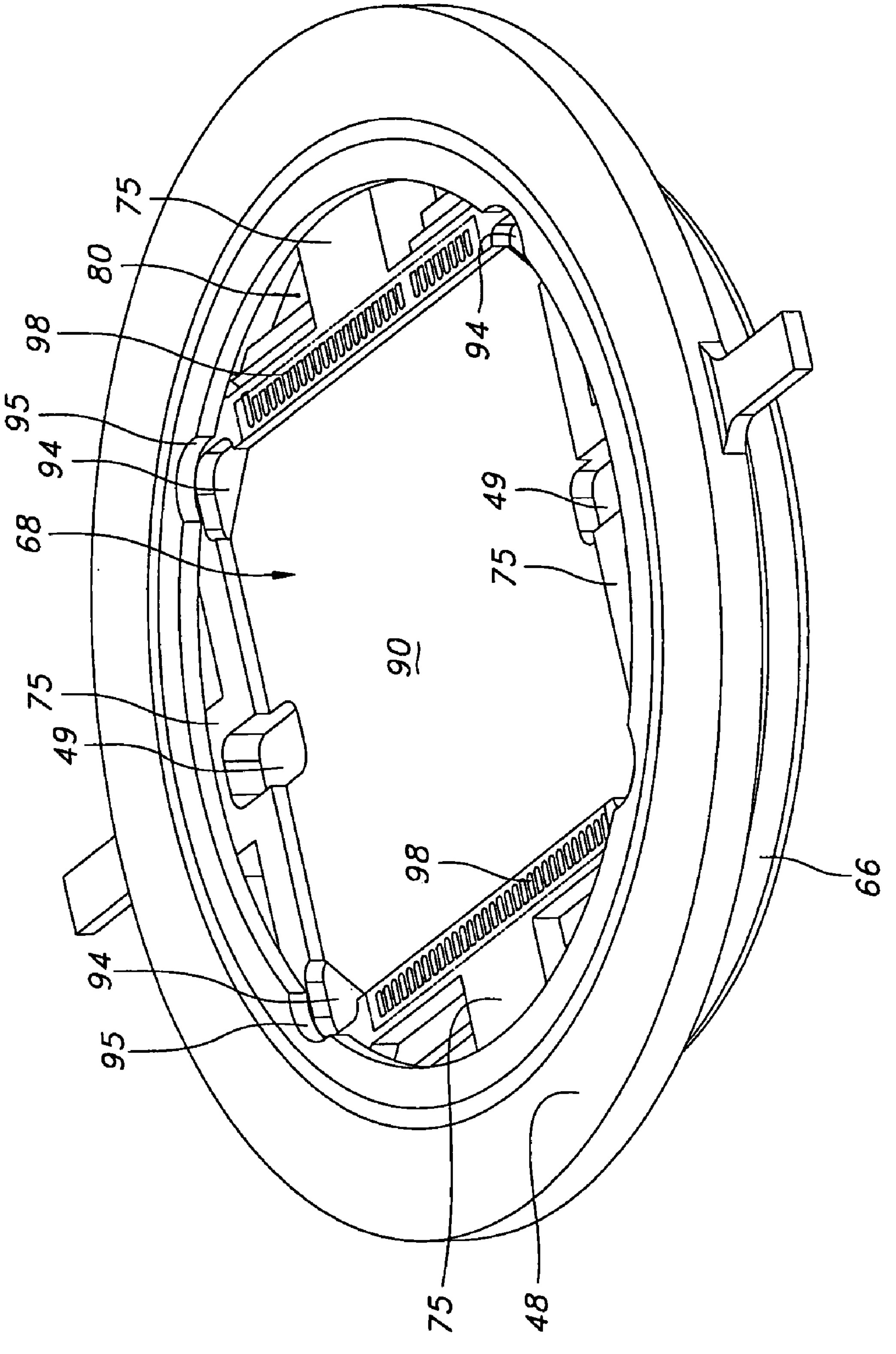
FIG. 4A is a perspective view from the top side of a sub-assembly of the image intensifier tube of FIG. 1 comprising a CMOS header, an MCP spacer and an interior sealing member.
Figure 4B:
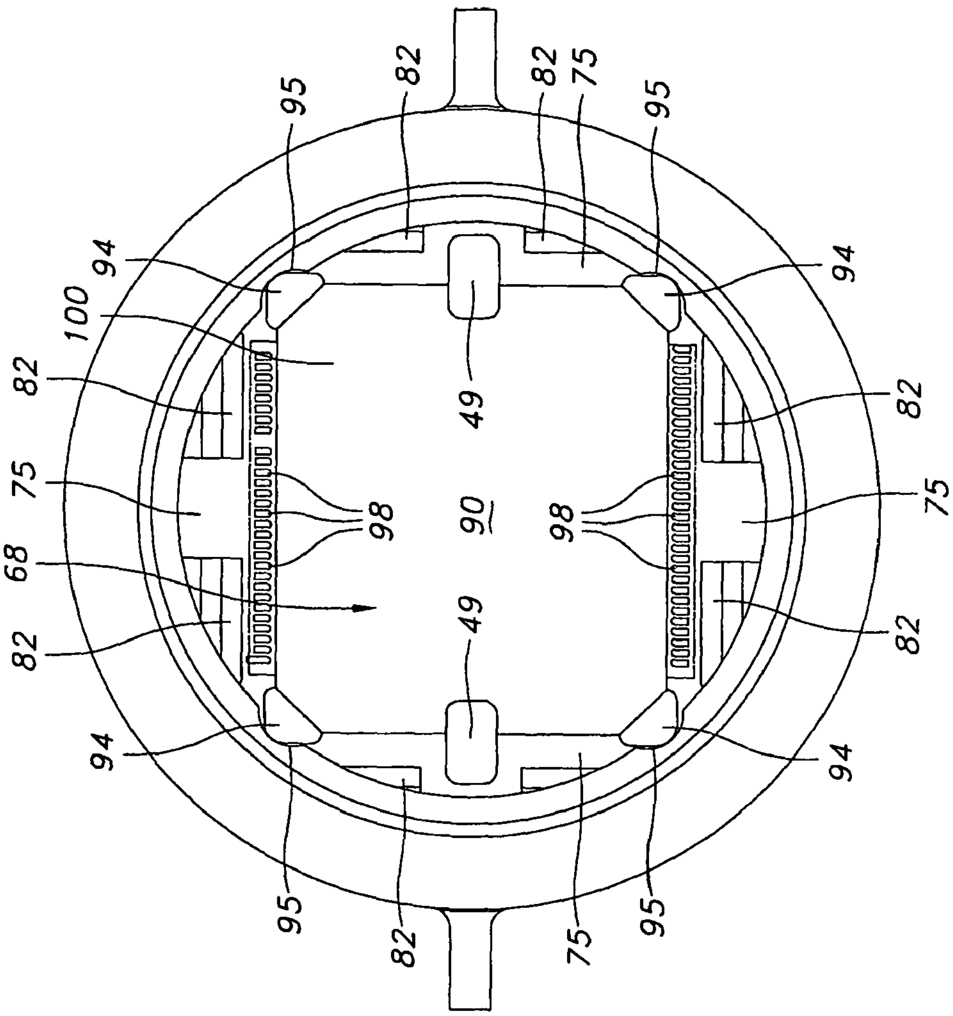
FIG. 4B is a top plan view of the sub-assembly of FIG. 4A.

FIGS. 4A and 4B depict perspective and top plan views, respectively, of a sub-assembly of image intensifier tube 10 of FIG. 1 comprising CMOS header 68, MCP spacer 48 and interior sealing member 66. Additional details of those components are described hereinafter. Lower surface 73 of MCP spacer 48 (see FIG. 3B) is positioned to face surface 75 of header 68. A brazing ring (not shown) is sandwiched between MCP spacer 48 and header 68 for hermitically sealing those components together. Another brazing ring (not shown) is sandwiched between CMOS header 68 and interior sealing member 66 for hermitically sealing those components together.

As described previously, CMOS die 43 (see FIGS. 1-3B) is mounted to a surface of header 68. Header 68 includes a rectangular-shaped recessed surface 90 for accommodating the rectangular body of CMOS die 43. Those skilled in the art will recognize that the shape of the CMOS die 43 and recessed surface 90 may vary from that shown. The CMOS die 43 may be mounted within recessed surface 90 by an adhesive, such as epoxy, for example. A series of channels 94 are provided in the corners of recessed surface 90 to collect excess adhesive applied to the undersurface of CMOS die 43. The MCP spacer 48 includes a recess 95 corresponding to each channel 94. Each channel 94 extends to an elevation that is lower than the elevation of recessed surface 90 such that channels 94 are deeper than recessed surface 90. In other words, a distance separating surface 75 and channel 94 is greater than a distance separating surface 75 and recessed surface 90. In assembly, excess adhesive applied to the underside of CMOS die 43 is funneled into channels 94.

A series of surface mount pads 98 are provided on surface 75 of header for connecting to leads extending from CMOS die 43 (not shown). Each surface mount pad 98 is connected to pin 45 (see FIG. 1) of the silicon imager assembly by an internal trace (not shown) routed through the body of header 68.

Referring now to FIGS. 1, 4A and 4B, alignment of a silicon imager with respect to other components of an image intensifier tube, such as an MCP, a photocathode or a tube housing, for example, can be desirable to ensure proper functioning of the tube. Alignment of the silicon imager can often be a laborious and time-consuming process. In a standard image intensifier tube assembly procedure, a silicon imager is mounted to a surface of a ceramic header. Other tube components, such as the MCP, the photocathode or the tube housing must be aligned with respect to the silicon imager. Special care must be undertaken by assembly personnel to spatially align other components of the tube with respect to the location of the silicon imager to ensure proper functioning of the image intensifier tube. It would be desirable to incorporate alignment features into an image intensifier device to facilitate rapid and accurate assembly.

Tube 10 incorporates unique alignment features to facilitate rapid and accurate spatial alignment between silicon imager 20 and other components of tube 10, such as housing 10, MCP 16 and photocathode 14, for example. More specifically, according to one aspect of the invention and as best shown in FIG. 1, tube 10 includes means 100 for aligning the image sensor 20 with respect to header 68. According to is this exemplary embodiment, image sensor alignment means 100 is provided in the form of recessed surface 90 of header 68 that is sized to accommodate the frame of image sensor 20 such that image sensor 20 is at least partially retained within recessed surface 90. The miniscule gap between the boundaries of image sensor 20 and recessed surface 90 is maintained to a relatively tight tolerance, such that the position of image sensor 20 with respect to the position of header 68 is known to a precise degree. Thus, the position of image sensor 20 with respect to header 68 is pre-determined, i.e., known. It should be understood that image sensor 20 is limited from horizontal translation and rotation within recessed surface 90.

Still referring to FIG. 1, tube 10 further comprises means 102 for aligning header 68 with respect to housing 12 of tube 10. According to this exemplary embodiment, header alignment means 102 is provided in the form of a recess 49 formed on a surface of header 68 that is sized to accommodate a protrusion 51 extending from rear cover 13 of housing 12. The protrusion 51 may be provided in the form of a surface, a pin or a fastener, for example, or any other alignment mechanism known to those skilled in the art. The miniscule gap between the boundaries of protrusion 51 and recess 49 is maintained to a relatively tight tolerance, such that the position of header 68 with respect to the position of housing 12 is known to a precise degree. Thus, the position of header 68 with respect to housing 12 is pre-determined, i.e., known. It should be understood that engagement between recess 49 of header 68 and protrusion 51 of housing 12 limits horizontal translation and rotation of header 68 with respect to housing 12.

Because the horizontal distance between recessed surface 90 and recess 49 is pre-determined, it follows that the horizontal distance between silicon imager 20 and housing 12 is also pre-determined. Accordingly, by incorporating means 100 and 102 into the design of tube 10 the complexity of assembling tube 10 is substantially reduced because the horizontal position of silicon imager 20 with respect to housing 12 is pre-determined resulting in rapid and accurate positioning of silicon imager 20 with respect to other components of tube 10, such as MCP 16 and photocathode 14.

MCP 16 and photocathode 14 are mounted either indirectly or directly to housing 12. The position of MCP 16 and photocathode 14 with respect to housing 12 may also be predetermined. Accordingly, because the horizontal position of image sensor 20 with respect to housing 12 is pre-determined and the horizontal positions of MCP 16 and photocathode 14 with respect to housing 12 are pre-determined, it follows that the relative horizontal positions of MCP 16 and photocathode 14 with respect to image sensor 20 are also pre-determined.

As best shown in FIG. 4A, recesses 49 and recessed surface 90 both extend from surface 75 of header 68. By forming both recess 49 and recessed surface 90 on the same surface of header 68 the relative horizontal distance between recess 49 and recessed surface 90 can be maintained with greater precision, i.e., resulting in a lower dimensional tolerance, than forming recesses 49 and recessed surface 90 on different surfaces of header 68. Alternatively, as shown in FIG. 1, recess 49 and recessed surface 90 may be defined on opposing surfaces of header 68.

The image sensor alignment means 100 may vary from that shown and described herein without departing from the scope and spirit of the invention. By way to of non-limiting example, image sensor alignment means 100 may comprise a protrusion formed on header 68 against which a surface of image sensor 20 is positioned. Additionally, header alignment means 102 may also vary from that shown and described herein without departing from the scope and spirit of the invention. By way of non-limiting example, header alignment means 102 may comprise a protrusion is extending from header 68 that is sized to be positioned within a recess formed on housing 12.

Alignment means 100 and 102 are not limited to being incorporated into an image intensifier device, as they could be incorporated into any electronic device incorporating a sensor such as a longwave or shortwave infrared sensor device, for example. Moreover, the sensor may be an image sensor such as a complementary metal oxide semiconductor (CMOS) or a charged coupled device (CCD), or any other type of sensor known to those skilled in the art.

According to one aspect of the invention, a method of aligning image sensor 20 with respect to housing 12 of tube 10 is provided. The method includes the step of positioning image sensor 20 on recessed surface 90 of header 68. The header 68 is positioned within housing 12. A second alignment element, such as recess 49 of header 68 is aligned with an alignment element, such as protrusion 51, defined or positioned on a surface of housing 12. The foregoing steps are not performed in any particular order.

Still referring to FIG. 1, the vertical distance separating lower conductive surface 44 of MCP 16 from the top surface of CMOS die 43 is held to a tight tolerance (e.g., +/−0.001 inches). In order to achieve such a tight tolerance, assembly of tube 10 is performed in the following order: spacer 48 is brazed (or otherwise mounted) to header 68; the spatial location of the top surface of spacer 48 is determined; and recessed surface 90 is formed in header 68 with respect to the location of the top surface of spacer 48. By performing the steps in this order, the vertical distance separating the top surface of spacer 48 from the recessed surface 90 can be held to a tight tolerance, and consequently, the vertical distance separating lower conductive surface 44 of MCP 16 from the top surface of CMOS die 43 can also be held to a tight tolerance.

Figure 5:
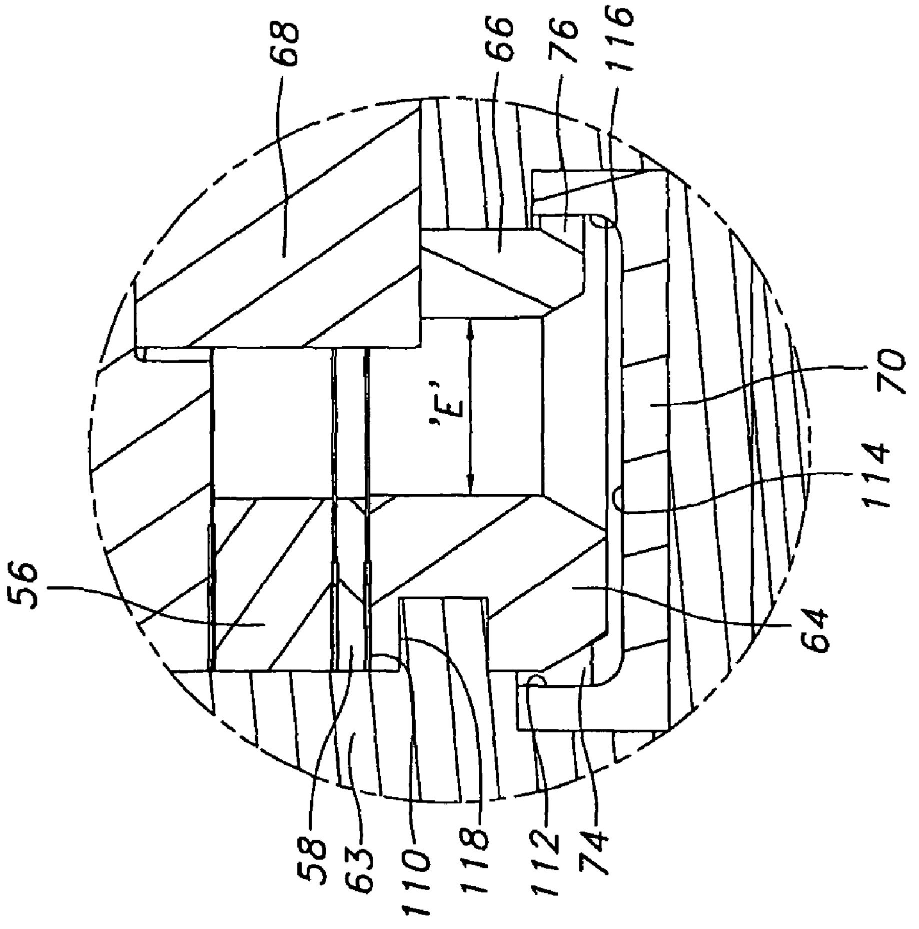
FIG. 5 depicts a detailed view of the lower sealing structure of the image intensifier tube of FIG. 1.

FIG. 5 depicts a detailed view of annular sealing members 64 and 66 of tube 10 of FIG. 1. The lower end of vacuum housing 12 is vacuum-sealed by the presence of exterior sealing member 64 and interior sealing member 66. The interior sealing member 66 is brazed to the lower surface of ceramic header 68 by a brazing ring (not shown) and extends downwardly therefrom. The exterior sealing member 64 is brazed to getter shield 58 by brazing ring 110 and extends downwardly therefrom. The exterior sealing member 64 is positioned to extend adjacent to and substantially parallel with interior sealing member 66 such that a gap "E" is defined between sealing members 64 and 66.

The exterior sealing member 64 and interior sealing member 66 are positioned in sealing contact with annular seal cup 70 to maintain a vacuum condition within housing 12. The sealing members 64 and 66 may be formed from Kovar™, for example, or any other suitable material known to those skilled in the art. A first seal 74 occurs at the interface between exterior sealing member 64 and seal cup 70. The first seal 74 is formed between exterior sealing member 64 and lateral surface 112 and/or intermediate surface 114 of seal cup 70. A second seal 76 occurs at the interface between interior sealing member 66 and seal cup 70. The second seal 76 is formed between interior sealing member 66 and medial surface 116 and/or intermediate surface 114 of seal cup 70. The combination of exterior sealing member 64 and interior sealing member 66 may be referred to as a double-dagger sealing member because each sealing member 64 and 66 incorporates a dagger-like shape.

Potting material 63 is situated in the annular space defined between housing 12 and the interior components of tube 10. The front and rear covers 11 and 13 of housing 12 are positioned to substantially encapsulate potting material 63. A groove 118 is formed along an exterior revolved surface of exterior sealing member 64 within which potting material 63 is located. The groove 118 assists in setting of internal spacing of photocathode 14 in an effort to optimize performance of tube 10. The combination of potting material 63, seal 74, seal 76 and the brazed interfaces described with reference to FIG. 1, form an air tight envelope defined by vacuum housing 12.

The arrangement of components shown in FIG. 5 is not limited to that shown and described herein. The sealing members 74 and 76 may extend from any component of tube 10. For example, exterior sealing member 64 may extend either indirectly or directly from photocathode 14. Additionally, sealing members 74 and 76 may extend to different elevations or be positioned at different angles with respect to each other. The overall shape of sealing members 74 and 76 may be straight, annular (as shown), or any other shape to conform to the geometry of tube 10.

Figure 6:
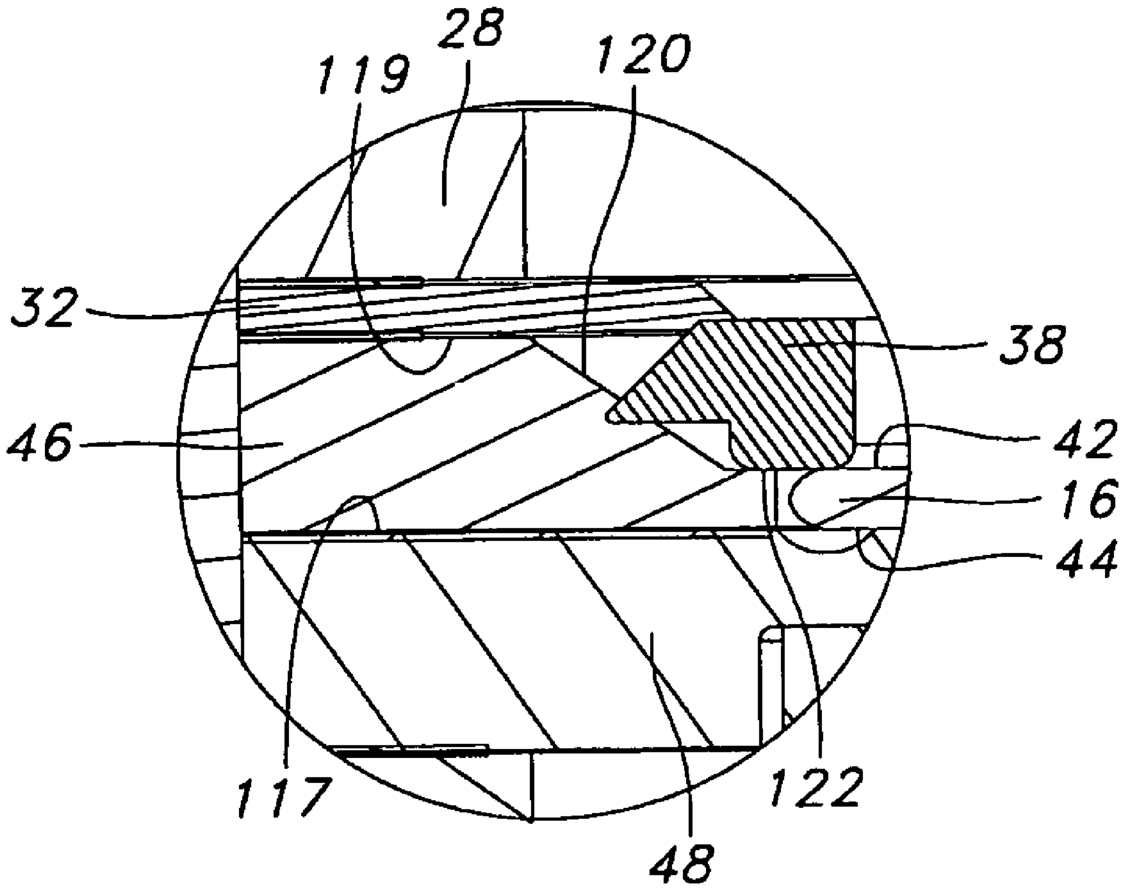
FIG. 6 depicts a detailed view of the image intensifier tube of FIG. 1.

FIG. 6 depicts a detailed view of MCP 16 of FIG. 1. The upper MCP terminal 32, provided in the form of a metallic contact ring, is joined to first ceramic spacer 28 by a brazing ring. The upper MCP terminal 32 extends into vacuum housing 12 where it conductively engages metallic snap ring 38. The metallic snap ring 38 engages a conductive upper surface 42 of MCP 16. An electrical bias may be applied to upper conductive surface 42 of MCP 16 by applying the electrical bias to upper MCP terminal 32 on the exterior of the vacuum housing 12.

The spacer 46 is positioned at an elevation below upper MCP terminal 32, isolating upper MCP terminal 32 from lower MCP terminal 48. The spacer 46 may be formed from an insulative material, such as ceramic. The spacer 46 is brazed to both upper MCP terminal 32 and lower MCP terminal 48. The lower MCP terminal 48 extends into vacuum housing 12 and engages the lower conductive surface 44 of MCP 16. As such, lower conductive surface 44 of MCP 16 may be coupled to ground by connecting lower MCP terminal 48 to a ground potential external to vacuum housing 12. Although not explicitly shown, lower MCP terminal 48 includes a conductive region for connecting lower conductive surface 44 of MCP 16 to a ground potential. The lower MCP terminal 48 may also be referred to hereinafter as an MCP spacer.

The spacer 46 includes a bottom surface 117 positioned to face the top surface of lower MCP terminal 48. A top surface 119 of spacer 46 is positioned to face the bottom surface of upper MCP terminal 32. An angled surface 120 spacer 46 extends, at least partially, between top surface 119 and bottom surface 117 of spacer 46 at a pre-determined angle with respect to top surface 119 of spacer 46. The angle of surface 120 impacts the structural integrity of spacer 46. The angle of surface 120 with respect to top surface 119 may be between about 30 degrees and about 60 degrees, for example. Alternatively, the angle of surface 120 with respect to top surface 119 may be about 45 degrees.

The angled surface 120 extends from top surface 119 of spacer 46 and intersects an intermediate surface 122 that is defined at an elevation between top surface 119 and bottom surface 117 of spacer 46. The intermediate surface 122, top surface 119 and bottom surface 117 of spacer 46 are substantially planar and parallel with respect to one another. A thickness dimension of spacer 46 that is measured between intermediate surface 122 and bottom surface 117 of spacer 46 is substantially equal to a thickness dimension of MCP 16, as best shown in FIG. 6. Stated another way, intermediate surface 122 and upper conductive surface 42 of MCP 16 are positioned at substantially the same elevation. By maintaining intermediate surface 122 and upper conductive surface 42 of MCP 16 at the same elevation, the lower surface of metallic snap ring 38 is positioned to engage the top surfaces of both MCP 16 and spacer 46 along a single plane.

This written description sets forth the best mode of carrying out the invention, and describes the invention so as to enable a person of ordinary skill in the art to make and use the invention, by presenting examples of the elements recited in the claims. The patentable scope of the invention is defined by the claims, and may include other examples that occur to those skilled in the art.

While exemplary embodiments of the invention have been shown and described herein, it will be understood that such embodiments are provided by way of example only. Numerous variations, changes and substitutions will occur to those skilled in the art without departing from the spirit of the invention. For example, aspects of the invention are not limited to image intensifier devices, as those aspects may also apply to other optical or electronic devices. Accordingly, it is intended that the appended claims cover all such variations as fall within the spirit and scope of the invention.

What is claimed:

1. An imaging device comprising:

a housing;

an image sensor assembly including a header and an image sensor mounted to the header, wherein the header is coupled to the housing;

means for aligning the image sensor with respect to the header, wherein the image sensor alignment means comprises a recessed mounting surface formed in the header for accommodating a body of the image sensor such that the image sensor is at least partially retained within the recess; and means for aligning the header with respect to the housing of the imaging device, wherein the header alignment means comprises a recess defined in the header that is sized to accommodate a protrusion formed on the housing, wherein the header alignment means is configured to limit translation and rotation of the header with respect to the housing;

wherein a distance separating the image sensor alignment means and the header alignment means is pre-determined such that a distance between the image sensor and the housing of the imaging device is pre-determined.

2. The imaging device of claim 1, wherein the image sensor is either a complementary metal oxide semiconductor (CMOS) or a charged coupled device (CCD).

3. The imaging device of claim 1, wherein the imaging device is an image intensifier device.

4. The imaging device of claim 1, wherein the recess of the header and the recessed mounting surface of the header are defined on different surfaces of the header.

5. The imaging device of claim 1, wherein the recess of the header and the recessed mounting surface of the header are defined on the same surface of the header.

6. The imaging device of claim 1 further comprising a microchannel plate (MCP) either directly or indirectly mounted to the housing, wherein a position of the microchannel plate with respect to the position of the image sensor is pre-determined.

7. The imaging device of claim 6 further comprising an MCP spacer sandwiched between the MCP and the header, wherein the MCP spacer includes an MCP mounting surface upon which the MCP is mounted, and wherein a vertical distance separating the recessed mounting surface of the header from the MCP mounting surface of the MCP spacer is pre-determined.

8. The imaging device of claim 1, further comprising a photocathode either directly or indirectly mounted to the housing, wherein a position of the photocathode with respect to the position of the image sensor is pre-determined.

9. The imaging device of claim 1 further comprising an aperture formed in the housing to accommodate a plurality of electrical pins that are electrically connected to the image sensor.

10. The imaging device of claim 1, wherein translation and rotation of the image sensor is limited by the recessed mounting surface.

11. The imaging device of claim 5 further comprising surface mount pads positioned on said same surface of the header that are each configured for connecting to the image sensor.

12. The imaging device of claim 5 further comprising:

a microchannel plate (MCP) either directly or indirectly mounted to the housing, wherein a position of the microchannel plate with respect to the position of the image sensor is pre-determined; and an MCP spacer sandwiched between the MCP and said same surface of the header, wherein the MCP spacer includes an MCP mounting surface upon which the MCP is mounted, and wherein a vertical distance separating the recessed mounting surface of the header from the MCP mounting surface of the MCP spacer is pre-determined.

13. The imaging device of claim 1 further comprising channels formed in corners of the recessed surface to collect excess adhesive applied to an undersurface of the image sensor.

14. The imaging device of claim 12, wherein each channel extends to an elevation that is lower than an elevation of the recessed mounting surface such that excess adhesive is funneled into the channels.

* * * * *